US006707288B2

(12) United States Patent
  Keating

(10) Patent No.: US 6,707,288 B2
(45) Date of Patent: Mar. 16, 2004

(54) APPARATUS FOR PRODUCING AND TESTING ELECTRONIC UNITS

(75) Inventor: David Keating, Limerick (IE)

(73) Assignee: Power-One A.G., Uster (CH)

( * ) Notice: Subject to any disclaimer, the term of this patent is extended or adjusted under 35 U.S.C. 154(b) by 6 days.

(21) Appl. No.: 10/106,887

(22) Filed: Mar. 26, 2002

(65) Prior Publication Data

US 2002/0186034 A1 Dec. 12, 2002

(51) Int. Cl.[7] .............................................. G01R 31/02
(52) U.S. Cl. .................................... 324/158.1; 324/755
(58) Field of Search ............................... 324/158.1, 750, 324/755, 754, 759, 763; 438/464; 257/9, 668, 51.16, 29.303

(56) References Cited

U.S. PATENT DOCUMENTS 5,404,272 A * 4/1995 Lebailly et al. ............. 361/700

5,798,652 A * 8/1998 Taraci ......................... 324/754

* cited by examiner

Primary Examiner—Evan Pert
Assistant Examiner—Trung Q. Nguyen
(74) Attorney, Agent, or Firm—Carter Schnedler & Monteith

(57) ABSTRACT

A carrier board which has a plurality of conduction layers is provided. A plurality of electronic units are produced on surface regions of the board with electronic components arranged at regular spacing. The surface regions, for use in a separation operation, are held at predetermined separating regions to a frame. The frame has an externally contactable, connecting region for an operating voltage or load for electronic units. Each electronic unit can be acted upon with the operating voltage or a load, by way of supply, load and/or signal lines in the frame and at separating regions of the carrier board. The electronic units can be operated and tested by the supply as well as the load and/or signal lines in a full-load mode of operation.

9 Claims, 2 Drawing Sheets

APPARATUS FOR PRODUCING AND TESTING ELECTRONIC UNITS

BACKGROUND OF THE INVENTION

The present invention concerns an apparatus for producing and testing a plurality of preferably identical electronic units, in particular in power electronics units.

Apparatuses of that kind, in the form of what are referred to as panels, are generally known from the state of the art for efficiently fitting electronic units or assemblies. More precisely, the panel is a printed circuit board on which, in the respective surface regions thereof, the respective printed circuit board structures are formed for equipping with electronic components for the electronic units; typically such a panel includes between 10 and 30 surface regions arranged in matrix form for identical electronic units which can then be fitted in a common fitting operation in an automatic fitting device (usually the panel makes use of a commercially advantageous fitting surface of an automatic fitting device).

After the fitting or soldering operation, the panel is then divided up, by a procedure whereby the surface regions equipped with components are separated from an unequipped surrounding frame region of the panel (carrier board member), for example by sawing or breaking.

It is then possible in that manner, in one working operation, to efficiently produce a relatively large number of electronic units (which are usually identical), and they are now individually associated with respective casings and then tested or operated in a load mode of operation for a predetermined period of time (burn-in) in order to afford the appropriate functional capability of the respective modules.

Testing and checking devices (often also automated) exist for those burn-in or further functional tests, in which respect conventionally (in otherwise known manner) each electronic unit is provided, as a test piece, with operating voltage signals and further test or load signals; typically, that is effected by means of contact spring pins or the like contact means, which are generally known from the state of the art, in which respect, particularly in the sector of power electronics involving correspondingly high currents which also already have to flow during the burn-in or test phases, it is particularly desirable if a test piece in question is also already provided with suitably equipped plugs or the like contact devices.

Particularly however when dealing with SMD technology and if, for example for reasons relating to design or space, no plug elements have been fitted and soldered in place, the application of operating voltage and load signals for high currents gives rise to problems; burn-in procedures can last for several hours or even days and in the case of voltage transformers or the like electronic units in power electronics, currents of several amperes flow by way of a test contact. That gives rise to correspondingly high demands in terms of the contact quality or minimization of the corresponding contact resistances, as far as the impossibility of true full-load operation, as common external testing systems with contact needles or the like contact elements which can be applied to the test pieces are either a priori not suitable for such current strengths, or however the (necessarily high) contact resistances, with the power levels being contacted, result in a correspondingly great rise in temperature of the arrangement.

A further potential disadvantage of such test procedures, particularly in the area of power electronics, is that contacting with an automatic testing apparatus, for the high currents involved, can typically only be automated with difficulty, or requires a high level of set-up and assembly complication and expenditure so that this also involves a considerable degree of complication (which is detrimental in terms of costs in mass production).

OBJECTS OF THE INVENTION

Therefore the object of the present invention is to develop an apparatus for producing electronic units, in particular in regard to their test properties for a high-power or heavy-current sector, to improve the test quality and the practical implementability of tests under full load over a relatively long period of time (or indeed first to permit such) and generally to make the testing of electronic units in power electronics, subsequently to an automated fitting process, more economical, faster and more reliable.

SUMMARY OF THE INVENTION

More specifically, in a manner which is advantageous in accordance with the invention, the carrier board member is such that it permits not only the fitment (already generally known from the state of the art) with electronic units in the surface regions respectively associated with an electronic unit, but in addition the carrier board member, by means of the central electrical connecting region which is preferably disposed in edge relationship on the carrier board member and permits cooperation with an external contact plug, affords the possibility of simultaneously feeding operating voltage or load signals to the respective electronic units, in the condition of not yet being separated, so that while still in that condition as an unseparated overall board member, it is possible to carry out a complete functional test in respect of all units. In that respect, it is provided on the one hand for all electronic units to be operated in parallel, but on the other hand there is the possibility of applying individualized signals for each electronic unit as, as can be seen from a preferred development, in particular the load and/or signal lines are provided individually for each electronic unit, are taken out of the central electrical connecting region, and can be actuated separately.

In accordance with the invention that is made possible by virtue of the fact that, outside the surface regions for the actual electronic units, the carrier board member also has conductor tracks provided in the conduction layers, wherein those conductor tracks connect the central electrical connecting region to the conductor tracks in the respective surface regions and for that purpose are also passed by way of the separating regions. In that respect, there is particularly preferably provided in accordance with the invention, for each of the plurality of electronic units in the frame region and in an associated separating region, at least one load and/or signal line which can be individually contacted externally by way of the electrical connecting region and actuation with the operating voltage is effected in any case by way of supply lines. Suitable dimensioning of the respective conduction layers or lines ensures that high currents necessary for full-load tests can also flow, and integration into the common carrier board member always permits optimum contact reliability or signal transmission to the respective component-equipped surface regions as test pieces. Contact problems as occur in particular when using externally applied contact pins of automatic testing apparatuses when high current levels are involved and over test periods of several hours are thus completely eliminated, and also the danger that, for example due to contact problems, units or assemblies which are actually properly functional are wrongly recognized as being defective and are separated off.

In that respect it is particularly preferred for the separating regions to be of such a configuration that on the one hand they still afford sufficient space for passing the conductor tracks to and from the surface regions, while on the other hand facilitating subsequent separation. In an otherwise known manner, it is thought that once again separating procedures using sawing (with suitably rotating saw blades) or by means of a breaking-off procedure can be used for that purpose. In order to facilitate that separation operation, the carrier board member already has suitable slot-shaped openings which already substantially predetermine the contour of the respective surface region and thus the later electronic module.

It is particularly preferable for the carrier board member and accordingly the surface regions to be equipped on both sides; particularly if it is then also in the form of a multi-layer with a plurality of inwardly disposed conductor track layers, it is possible in that way to achieve highly compact arrangements which afford a correspondingly large number of possible ways of testing the arrangement or contacting it for test purposes, in the manner according to the invention, by way of inner layer portions.

It is preferably also provided that a contact frame is fitted on to a component-bearing side; contact frames of that kind can also be easily fitted in the context of the automated component-fitting operation and the automated soldering procedure and then afford a uniform contact surface for later contact purposes.

Accordingly the present invention clearly perceptibly overcomes the disadvantage of automated component-fitting and testing procedures, specifically in the power electronics sector, namely the problem of separate, releasable contacting for testing purposes for high currents and for a long period of time. The problem of existing systems is resolved in a surprisingly simple fashion by the use in accordance with the invention of the frame region surrounding the respective component-fitting surfaces of the electronic modules, for the application, with reliable contact, of supply and signal voltage to the individual units as well as supplying same and carrying same away by means of an individual common plug, without the properties for a subsequent separation operation being adversely influenced thereby.

BRIEF DESCRIPTION OF THE DRAWINGS

Further advantages, features and details of the invention will be apparent from the description hereinafter of preferred embodiments and with reference to the drawings in which.

DESCRIPTION OF THE PREFERRED EMBODIMENTS

Figure 1:
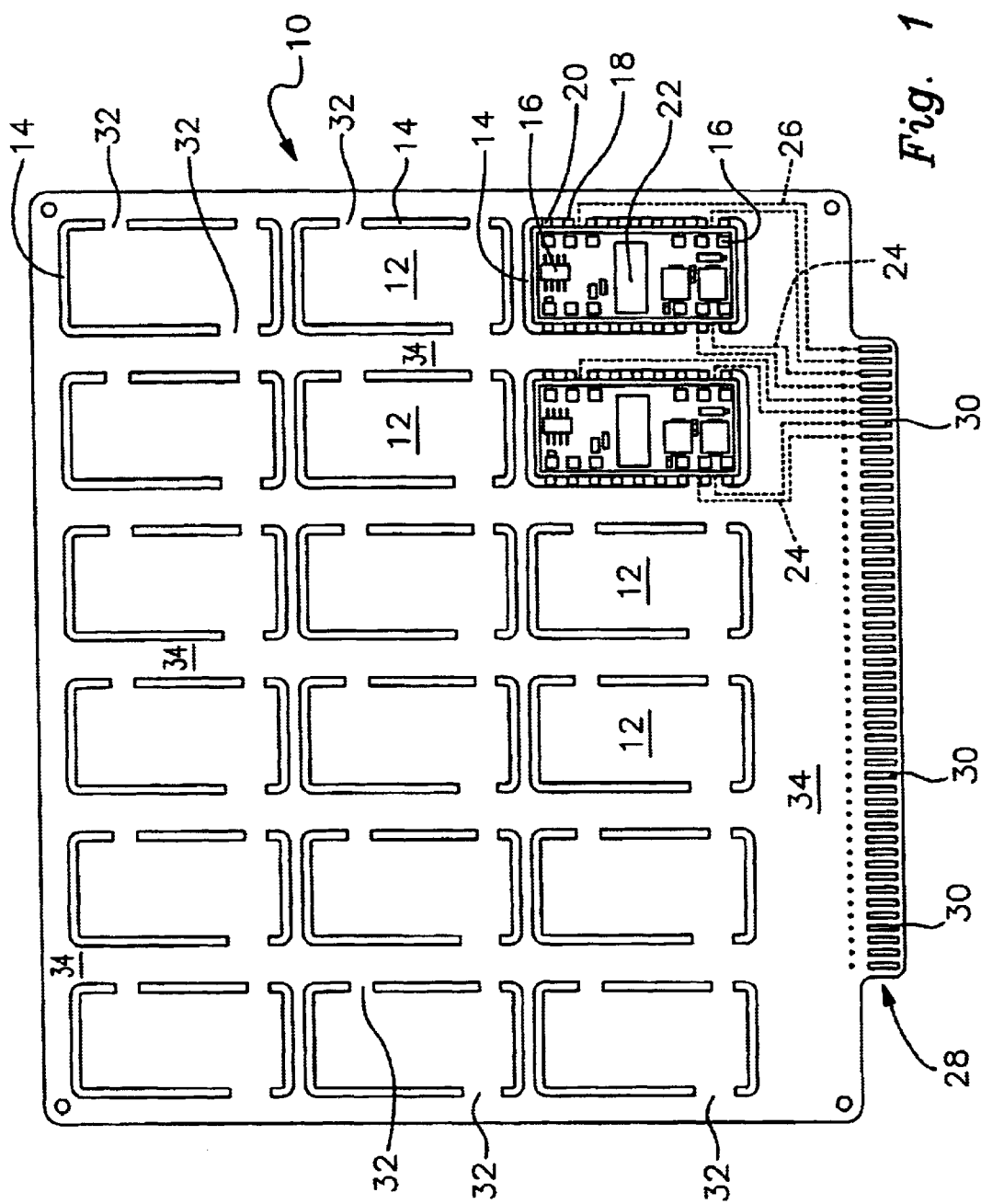
FIG. 1 shows an apparatus for producing and testing a plurality of electronic units in accordance with a first preferred embodiment in the form of a plan view on to a multi-layer print plate member as a carrier board member, in accordance with the invention (best mode)

The arrangement shown in FIG. 1 measuring about 230× 200 mm is an apparatus formed from a multi-layer circuit board material, comprising a carrier board member 10 within which eighteen surface regions 12 are shaped out—arranged at regular spacings in matrix form—, being delimited by surrounding cutout portions 14 in the form of elongate slots.

Figure 2:
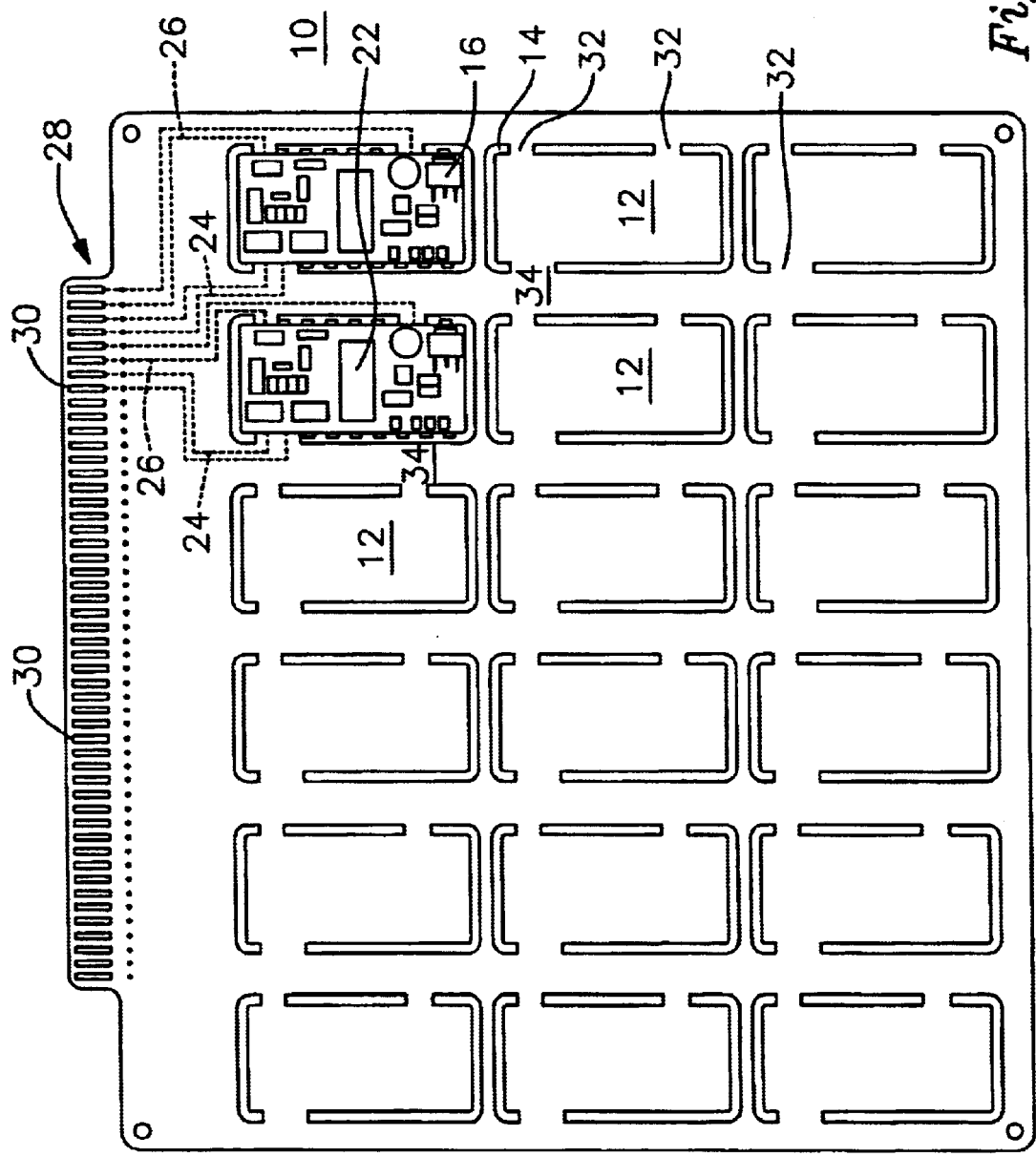
FIG. 2 shows a rearward view of the arrangement of FIG. 1 to show double-sided component equipment on the carrier board member.

A circuit of power electronics (module) is implemented on both sides on each of those surface regions 12, wherein the views in FIG. 1 and FIG. 2 respectively only show by way of example two surface regions which are equipped with components. In the specific embodiment the carrier board member 10 is then equipped with electronic components 16 within the respective surface regions 12, wherein in that way the carrier board member then carries a total of eighteen identical electronic units; in the illustrated embodiment by way of example, this involves DC-DC-converters as products in power electronics, which are designed for operating currents of the order of magnitude of several amps.

The component-fitting operation is effected in otherwise known manner by fitting components to the entire arrangement as shown in FIG. 1 or FIG. 2 (this involves an arrangement with components fitted on both sides) by means of otherwise known automatic component-fitting apparatuses or using SMD-capable electronic components which, after the automated component-fitting operation, can then be soldered in an automated procedure in an also known fashion.

As FIG. 1 also makes clear, provided on one side for the purposes of later contacting of a separated electronic module is a contact frame 18 which extends around the surface region 12 and which affords a plurality of contact connections 20 which are disposed in one plane in order to simplify contacting of the unit in question. The contact frame 18 affords the additional advantage that it can also be automatically fitted in place or soldered.

As diagrammatically indicated in the Figures, besides electronic components 16, transformer cores 22 are also fitted, in order to be able to provide corresponding functionalities in the respective units.

In contrast to the arrangements known from the state of the art for simultaneously fitting a plurality of identical units, the arrangement shown in FIG. 1 and FIG. 2 respectively additionally has voltage supply lines 24 or load and signal lines 26 which serve for feeding operating voltage or load signals to the respective fitted units on the carrier board member 10 and in that respect make a connection between the respective units and a central connecting bar 28 which projects laterally on the carrier board member 10.

In that respect, in the illustrated embodiment, a voltage supply and a connection of signal lines individually for each equipped electronic module is effected in the associated surface region 12 by way of respectively associated contacts 30 of the connecting bar 28; alternatively it is in particular also provided that the operating voltage supply is to be provided in parallel for all units, that is to say by way of common contacts 30.

In specific terms, the supply or signal lines 24 and 26 respectively are taken by way of mechanical separating regions 32 which within the carrier board member 10 connect regions 12 to a surrounding frame region 34 of the carrier board member 10. In other words, the separating regions 32 are the respective remaining limb or land portions which remain from the slots 14 extending around the respective surface regions 12, and thus provide for a mechanical connection between the surface region 12 and the surrounding frame region 34.

In accordance with the invention it is therefore possible for operational or functional tests in respect of the entirety of fitted or soldered electronic modules to be effected—individually or in respect of the entirety thereof—without, for test purposes, the respective electronic modules firstly having to be detached (separated) from the carrier board member 10 (by being cut away at the separating regions 32). On the contrary, a functional and testing procedure can be implemented simply by applying the supply voltage and the (selective) load signals to the respective contacts 30 of the connecting bar 28 and accordingly directly to the respective electronic modules, in which respect for that purpose ideally the carrier board member 10 only has to be connected to an automatic testing apparatus which, for receiving same or for electrical connection thereof, has a plug element to be associated with the connecting bar 28 and then test routines can be carried out in an otherwise known manner.

That is advantageous in many respects in comparison with the traditional testing of units (also produced as a plurality thereof) in the separated condition; on the one hand, the connection to an associated testing unit is drastically simplified for the respective individual electronic modules, as test pieces, no longer have to be connected to the automatic testing apparatus separately and individually, but this is effected jointly by way of the connecting region by means of the connecting bar 28. On the other hand, a marked improvement in contact quality for operational voltage or load signals is achieved, which has an effect in particular in the present area of power electronics. Thus, in the full-load mode in the case of DC-DC-converters as a typical example of use of the present invention, currents in the range of several amps flow, and in particular a burn-in test requires the maintenance of that loading over a period of several hours. Acting on the test pieces by means of known test pins or the like releasable contact elements would give rise to considerable contact or transfer resistances, with the result that not only is a (potentially harmful) generation of heat to be feared, but a lack of contact quality means that in particular even (otherwise satisfactory) test pieces are identified as being defective.

Even if the fact of passing supply voltage signals or load signals to the respective surface regions 12 in the carrier board member 10 and the additional provision of the connecting bar 28 gives rise to additional expenditure in manufacture of the carrier board member 10, that additional expenditure however appears rather negligible in consideration of the above-described positive properties: thus typically the printed circuit board region (which is to be suited patterned) in the frame region 34 surrounding the surface regions 12 is available in any case so that it is only necessary to produce here suitable lines (in which respect here in particular the configuration by way of example of the invention in the form of a multi-layer arrangement affords further advantages in terms of flexibly passing the various lines to the test pieces), and even when separating or dividing up the individual electronic modules from the carrier board member, typically by sawing or breaking at the separating regions 32, the conductor tracks which are passed here in accordance with the invention, for supply or signal purposes, do not involve any disadvantages which have an effect in a practical context.

Accordingly in that way there is provided an integrated production and testing method which is particularly suitable for the series production of products in power electronics and which combines optimum properties in regard to contactability of the respective test pieces to be tested after the component-fitting operation—even when involving high currents and over a relatively long period of time—with advantageous properties in terms of handling the test pieces in the automated insertion or introduction of the plurality of test pieces when they have not yet been separated, into a suitably designed automatic testing apparatus.

The present invention is not limited to the embodiment described; even if the invention has a main focus in respect of its area of use in the field of power electronics, the invention is also suitable in principle for the automated production and testing of electronic units and assemblies for other technical areas. The invention is also not restricted to the use of multi-layer print plate members and/or board members which are to be equipped with components on both sides; on the contrary any configurations, including conductor tracks which are fitted with components on one side or patterned on one side, are suitable for the present invention.

As already described above in addition various configurations of the voltage supply lines or the load and signal lines are possible; thus it is possible for those respective lines to be taken individually to each test piece (that is to say to each surface region) or however, with the load and signal lines being supplied individually, it is possible to provide a common voltage supply, or it is also possible for the load and signal lines to be passed in parallel and jointly to each test piece.

What is claimed is:

1. Apparatus for producing and testing a plurality of preferably identical electronic units, in particular electronic units in power electronics, comprising
    a carrier board member (10) which comprises a circuit board material and which has a plurality of conduction layers,
    wherein the plurality of electronic units can be produced on surface regions (12) of the carrier board member by a preferably automated fitting process with electronic components (16) and in particular are arranged at regular spacings from each other,
    and the surface regions (12) are held at predetermined separating regions (32) of the carrier board member, which are designed for a separation operation, to a frame region (34) of the carrier board member, the frame region extending around the surface regions, characterized in that
    the carrier board member in the frame region (34) has an externally contactable, central, electrical connecting region (28) for an operating voltage or load for the plurality of electronic units,
    each of the plurality of electronic units can be acted upon with the operating voltage, a load or another electrical signal, by way of supply, load and/or signal lines (24) formed in the frame region (34) and at an associated separating region (32) of the carrier board member, and
    the apparatus is so designed by dimensioning of the conduction layers that the plurality of electronic units can be operated and tested by means of the supply as well as the load and/or signal lines in a full-load mode of operation.

2. An apparatus as set forth in claim 1, characterized in that the carrier board member is embodied in the form of a multi-layer circuit board.

3. An apparatus as set forth in claim 1, characterized in that the carrier board member can be positioned in an automatic component-fitting arrangement and the surface regions are adapted to be fitted with components in an automated procedure.

4. An apparatus as set forth in claim 1, characterized by a contact frame (18) which is associated with each electronic unit and which can be fitted on to and mounted on a respective surface region preferably in an automated procedure and which performs a contact function for an electronic unit separated from the carrier board member in a final assembly condition and preferably also in a testing mode in respect of the unseparated electronic unit.

5. An apparatus as set forth in claim 1, characterized in that the surface regions (12), with the exception of the separating regions (32), are surrounded by an opening (14) which is formed in the circuit board material and which is preferably of an elongate configuration and the separating regions (32) act as integral connecting limbs between the frame region (34) and a respective surface region (12).

6. An apparatus as set forth in claim 1, characterized in that the electronic units can be separated from the frame region by separation of the surface regions at the separating region, in particular by breaking or cutting the separating region.

7. A method of fitting and testing a plurality of preferably identical electronic units, in particular electronic units in power electronics, characterized by the steps:

fitting electronic components to a plurality of surface regions of a carrier board member of circuit board material, which surface regions each correspond to a respective electronic unit and are delimited by cut-outs, operating individual ones or all of the plurality of electronic units in a full-load test mode by applying a supply voltage and preferably individual load signals to a common central connecting region of the circuit board outside the surface regions, separating the electronic units after termination of the full-load test mode by severing of a connecting and supply region between a respective surface region and a surrounding frame region of the carrier board member, and associating a separated electronic unit with an associated housing or an associated assembly unit.

8. A method as set forth in claim 7, characterized in that the operation of fitting components to the surface regions is effected in a double-sided manner.

9. A method as set forth in claim 7, characterized by additional contacting of the surface regions with removable contact pins of a testing device.

* * * * *